(12) United States Patent
Ning

(10) Patent No.: US 6,706,588 B1
(45) Date of Patent: Mar. 16, 2004

(54) METHOD OF FABRICATING AN INTEGRATED CIRCUIT HAVING EMBEDDED VERTICAL CAPACITOR

(75) Inventor: Xian J. Ning, Mohegan Lake, NY (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/410,551

(22) Filed: Apr. 9, 2003

(51) Int. Cl.$^7$ .......................................... H01L 21/8242
(52) U.S. Cl. ..................... 438/250; 438/253; 438/239; 438/393; 438/396
(58) Field of Search ................................. 438/239–242, 438/250–256, 393–399; 257/301–311

(56) References Cited

U.S. PATENT DOCUMENTS

| | | | |
|---|---|---|---|
| 4,409,608 A | 10/1983 | Yoder | |
| 5,162,890 A | 11/1992 | Butler | |
| 6,168,988 B1 * | 1/2001 | Schindler et al. | 438/253 |
| 6,168,991 B1 | 1/2001 | Choi et al. | |
| 6,228,707 B1 * | 5/2001 | Lin | 438/250 |
| 6,451,667 B1 * | 9/2002 | Ning | 438/397 |
| 6,524,926 B1 * | 2/2003 | Allman et al. | 438/387 |
| 6,576,479 B2 * | 6/2003 | Chen et al. | 438/3 |
| 6,593,185 B1 * | 7/2003 | Tsai et al. | 438/253 |
| 2002/0163058 A1 * | 11/2002 | Chen et al. | 257/532 |
| 2003/0060002 A1 * | 3/2003 | Bruchhaus et al. | 438/239 |

OTHER PUBLICATIONS

A High Reliability Metal Insulator Metal Capacitor for 0.18 um Copper Technology, M. Armacost, A. Augustin, P. Feslner. Y. Feng, G. Friese, J. Heidenreich, G. Hueckel, P. Prigge, K. Stein, pp. 157–161.

* cited by examiner

Primary Examiner—John F. Niebling
Assistant Examiner—Jennifer M. Kennedy
(74) Attorney, Agent, or Firm—Lerner, David, Littenberg, Krumholz & Mentlik, LLP

(57) ABSTRACT

Vertical capacitors are formed in a dielectric by a method that forms first and second electrodes spaced apart by a dielectric and substantially perpendicular to the surface of the dielectric. The capacitors may be formed in any dielectric level and are desirably planarized so that the capacitor plate and dielectric form a planar surface.

11 Claims, 3 Drawing Sheets

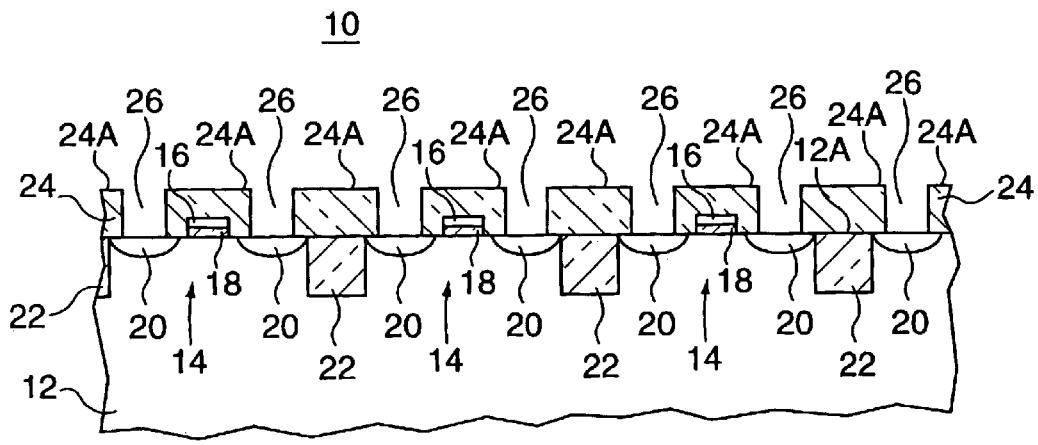
PRIOR ART FIG. 1
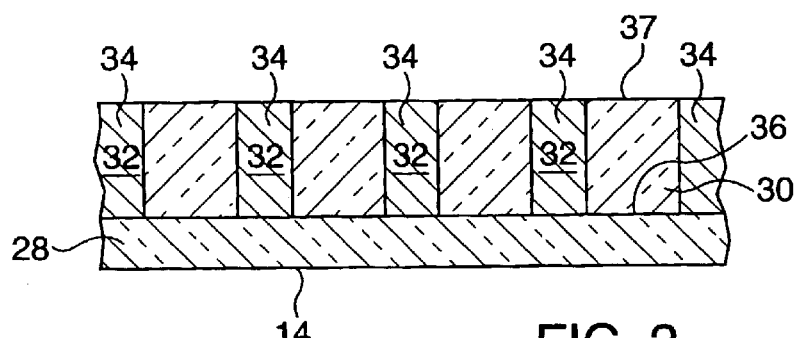
FIG. 2
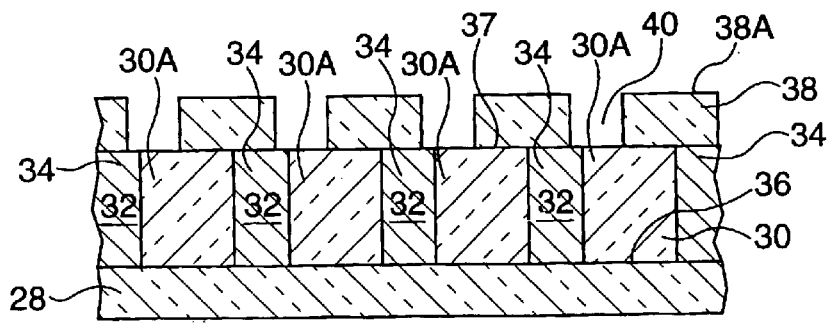
FIG. 3

METHOD OF FABRICATING AN INTEGRATED CIRCUIT HAVING EMBEDDED VERTICAL CAPACITOR

BACKGROUND OF THE INVENTION

This invention relates generally to a method of fabricating integrated circuits having capacitors, and more particularly, to a method of fabricating such circuits with vertical capacitors embedded in dielectrics.

integrated circuits typically have components in addition to the well-known components such as field effect and bipolar transistors. For example, capacitors are widely used to store charge in both analog and digital circuits such as the well-known dynamic random access memory (DRAM). A capacitor is formed by two conducting plates, generally parallel, that are spaced apart from each other by a dielectric. The stored charge is proportional to the product of the capacitance and voltage. The latter term is determined by system designers and, for some DRAMS, is in the range of 2 to 5 volts. The capacitance is proportional to the product of the plate area and dielectric constant divided by the distance between the plates. Regardless of the particular application, designers attempt to maximize the amount of charge stored by the capacitor subject, of course, to constraints imposed by fabrication costs and limited substrate area.

Many approaches to capacitor design and fabrication have been explored and several which have been published prior to the filing date of this application are briefly discussed below.

For example, U.S. Pat. No. 4,409,608, issued on Oct. 11, 1983 to Yoder, describes a recessed or embedded capacitor formed by removing material from a high resistivity substrate such as GaAs, and then filling the resulting recesses with a metal. The recesses are formed by a conventional lithographic technique. For example, a resist is deposited and patterned and the now exposed portions of the substrate removed to a desired depth. The resulting recesses are then filled with metal and the resist removed. The capacitor plates may be interleaved to increase the effective area of the capacitor plates.

Another approach is illustrated in U.S. Pat. No. 5,162,890, issued on Nov. 10, 1992 to Butler. This approach uses stacked capacitors; that is, a second capacitor is placed above a first capacitor and the two capacitors are connected in parallel. For example, in FIG. 8 of this patent, conducting plates of a first capacitor are formed by regions 38 and 42, and the conducting plates of a second capacitor are formed by regions 42 and 45. The dielectrics between the conducting plates are formed by regions 40 and 44 for the first and second capacitors, respectively. Stacked capacitors increase the capacitance per unit substrate area as compared to a single planar capacitor.

An approach to a capacitor formed in a dielectric with electrical contacts to the top and bottom electrodes in described in U.S. Pat. No. 6,168,991, issued on Jan. 2, 2001 to Choi. For example, FIG. 6 of this patent depicts a first electrode 20 and a second electrode 26 with a dielectric region 22 between the two electrodes. The embodiment depicted in FIG. 6 forms the capacitor in openings formed in a patterned dielectric 12 with the first electrode contacting a conductive plug 14. The layers forming the electrodes and the dielectric are sequentially deposited after the openings in the dielectric layer 12 are formed. The resulting capacitor requires only a single mask after transistor formation and is stated to be especially useful with DRAMs.

MIM (metal-insulator-metal) capacitors are widely used in both analog and mixed signal applications. An ability to integrate such capacitors into the back end of the line (BEOL) is desirable for many applications. A MIM capacitor is described by Armacost et al. in IEDM Technical Digest, 2000, pp 157–161. A sectional view of the capacitor is shown in FIG. 4 (a). There is a top plate above a bottom plate; both plates are defined lithographically and two masks are thus required. In addition to requiring two masks, the capacitor described therein has significant topography when finished.

SUMMARY OF THE INVENTION

A method of fabricating capacitors embedded in a back end of line (BEOL) or multi-level interconnects is described. The metal lines in BEOL may be formed by a dual or single damascene process used to fabricate an integrated circuit. The capacitor plates are separated from each other by a capacitor dielectric and are substantially perpendicular to a major surface of a silicon wafer on which the integrated circuit is formed. The plates and the dielectric layer have a planar surface.

Viewed from a first method aspect, the invention includes a method of fabricating an integrated circuit comprising the steps of: forming a dielectric layer on a substrate; patterning said dielectric layer to form trenches; forming first metal regions in said trenches, said first metal regions and said dielectric layer having a planar surface; patterning a resist layer to form openings which expose portions of said first metal regions and adjacent dielectric layer; etching said exposed metal regions and said dielectric to form trenches; depositing an insulating layer; forming second metal regions; and planarizing the surfaces of said first and second metal regions and said dielectric.

Viewed from a second method aspect, the invention includes a method of forming capacitors in a dielectric comprising the steps of: forming a plurality of trenches in a dielectric layer, said trenches being filled with a first metal to form first metal regions, said first metal regions and said dielectric layer forming a planar surface; selectively removing portions of said first metal regions and said adjacent dielectric; sequentially depositing a dielectric layer and a second metal; and planarizing said second metal, to form second metal regions, and said dielectric layer.

Viewed from a third method aspect, the invention is a method of fabricating an integrated circuit comprising the steps of: forming a plurality of devices in a semiconductor substrate, said devices having electrical contacts; forming at least one dielectric layer covering said devices and said substrate; fabricating capacitors in said at least one dielectric layer, said capacitors each having first and second plates separated by a second dielectric layer, said plates being formed in a trench and being substantially perpendicular to a major surface of the first dielectric layer; and forming electrical connections between said capacitors and said devices.

The invention will be better understood from the following brief description of the drawing, detailed description and claims.

BRIEF DESCRIPTION OF THE DRAWINGS

FIG. 1 is a sectional view of an integrated circuit at an early stage of fabrication;

FIGS. 2–6 are sectional views showing capacitor fabrication at various stages of fabrication according to the method of this invention;

Figure 4:
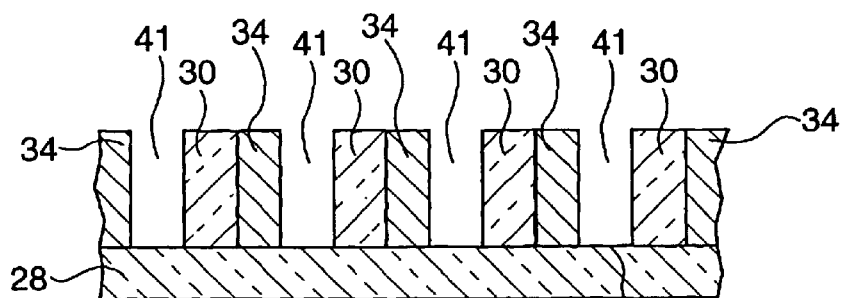

For reasons of clarity, the elements depicted are not drawn to scale.

DETAILED DESCRIPTION

Other than the inventive concept, the apparatus and methods for fabricating semiconductor devices are well-known and are not described further herein. Also, like numbers on different figures represent similar elements. The invention will be described by reference to a particular embodiment for fabricating a vertical capacitor. As used herein, the term "vertical capacitor" means a capacitor formed in a dielectric having first and second plates (electrodes) that are substantially perpendicular to a major surface of the dielectric.

FIG. 1 is a cross-sectional view of a prior art integrated circuit 10 at an early stage of fabrication. Depicted is a semiconductor substrate (body) 12 having a top surface 12A. Field effect transistors 14 are formed in substrate 12 with each having a gate electrode 16 separated from 12 surface 12A by a gate dielectric layer 18, and a pair of source/drain regions 20 separated by a portion of the substrate 12. Individual field effect transistors 14 are electrically isolated from each other by dielectric regions 22. In the embodiment depicted, the regions 22 are shallow trenches. A dielectric layer 24 having openings 26 therethrough covers the surface 12A of the semiconductor substrate 12 and has a top essentially planar surface 24A. Electrical contacts (not shown) are formed through openings 26 to source/drain regions 20.

The structure depicted will be readily fabricated by those skilled in the art, and variations from the particular structure depicted are contemplated. For example, although a shallow trench isolation scheme is depicted, a conventional LOCOS (localized oxidation of silicon) isolation could be used. The gate electrode 16 is formed by well-known deposition and patterning techniques. Source/drain regions 20 are typically formed by ion implantation but can be formed by deposition and drive of impurities. Dielectric layer 24 is typically a deposited silicon oxide and is lithographically patterned to expose portions of the source/drain regions 20.

The invention will be described in detail with respect to the embodiment depicted in sectional views in FIGS. 2, 3, 4, 5, and 6. The embodiment comprises vertical capacitors in a dielectric layer 30 which optionally can cover a top surface 36 of a dielectric layer 28.

Shown in FIG. 2 are the dielectric layer 28, a patterned dielectric layer 30 defining trenches 32, and first metal regions 34 filing trenches 32. Layers 28 and 30 share a common essentially planar surface 36. The dielectric layers can be normal inter-level dielectric in the back end of line (BEOL). Dielectric layer 28 optionally can be identical to dielectric layer 30 and can directly cover surface 12A of substrate 12 (of FIG. 1) instead of layer 28 with the transistors 14 not being present in the regions in which the capacitors are to be formed. Dielectric layer 28, where vias are embedded, acts as a substrate for dielectric layer 30, where metal lines sit in the case of a dual damascene processes. The term "substrate" is used to mean a region that lies underneath and supports an overlying region. Dielectric layer 30 has been patterned in the same process steps as a metal line pattern using conventional techniques to form trenches 32 which expose selected portions of dielectric 28. The depths of the trenches 32 are the height of metal lines as required. The trenches 32 are filled with a first metal and then planarized using, for example, chemical mechanical polishing (CMP) so that the surfaces of first metal regions 34 and dielectric 30 form a planar surface such as surface 37. Exemplary metals include tungsten and copper. The metal filling process can be done using conventional techniques such as chemical vapor deposition (CVD) or plating for copper. Some metals, for example, copper, diffuse rapidly into dielectrics such as silicon oxide. For such combinations of metal and dielectric, a barrier liner layer comprising, for example, TiN, is deposited prior to metal deposition. The barrier liner layer prevents unwanted diffusion into the dielectric. The barrier liner layer is not depicted.

After planarization has been completed, a photo-resist layer 38 having a top surface 38A is deposited and patterned to form windows 40 which expose portions of surface 37 which include portions of the first metal regions 34 and adjacent dielectric layer 30. The alignment of the windows with respect to the first metal regions 34 is not critical except that portions of the first metal regions 34 should be exposed to obtain maximum capacitance. If portions of first metal regions 34 are not exposed, some of the adjacent dielectric 30A of dielectric layer 30 will form part of the capacitor dielectric and thus increase the spacing between the capacitor plates. The resulting structure is depicted in FIG. 3.

An anisotropic etching technique, such as Reactive Ion Etching (RIE), is now used to form trenches 41 in the dielectric layer 30. These trenches 41 are adjacent to first metal regions 34; in fact, the etch desirably will remove, as explained above, a portion of first metal regions 34. Desirably, the etch stops at the common surface 36 between dielectric layers 28 and 30. Shallower etches will decrease the total capacitance (the area of one plate is reduced with shallower etches while deeper etches do not increase the capacitance). Use of dielectrics with different etch characteristics facilitates stopping at the interface between the two dielectrics 28 and 30. The resulting structure is depicted in FIG. 4.

Figure 5:
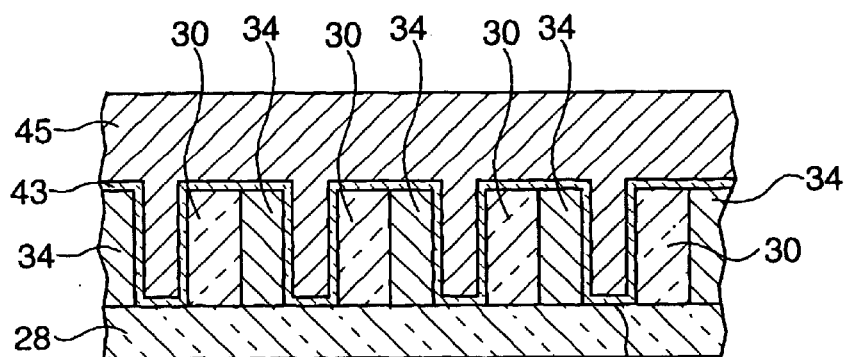

A dielectric layer 43 is now deposited over all exposed surfaces; this dielectric forms the capacitor dielectric. Exemplary dielectrics include silicon oxide, silicon nitride, and silicon oxynitride. A conformal deposition technique, as opposed to sputtering, is preferred because of better uniformity of coverage. Thickness is not critical; thicker layers decrease capacitance but thin layers may have pinholes which can result in electrical leakage. A second metal layer 45 is now deposited. Portions of metal 45 will form the second plate of the capacitor. Exemplary metals include tungsten and copper. Any conventional deposition technique may be used for the metal deposition. The resulting structure is depicted in FIG. 5.

Figure 6:
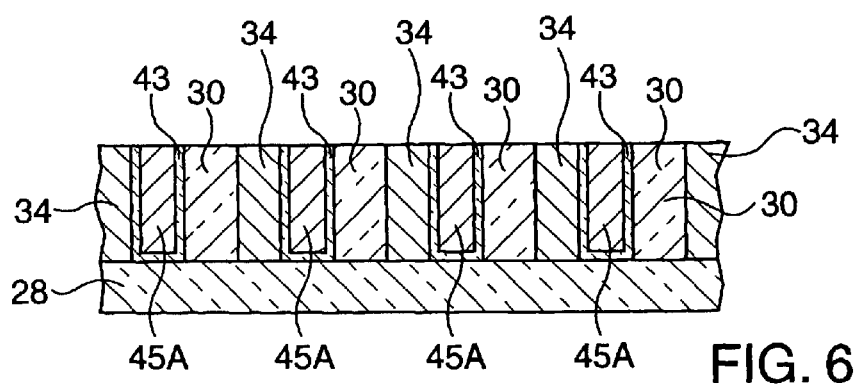

Conventional metal CMP techniques are now used to planarize metal layer 45 and to form metal regions 45A within the dielectric layer 30. The metal regions 45A form second plates of the capacitors. The resulting structure is depicted in FIG. 6.

Figure 7:
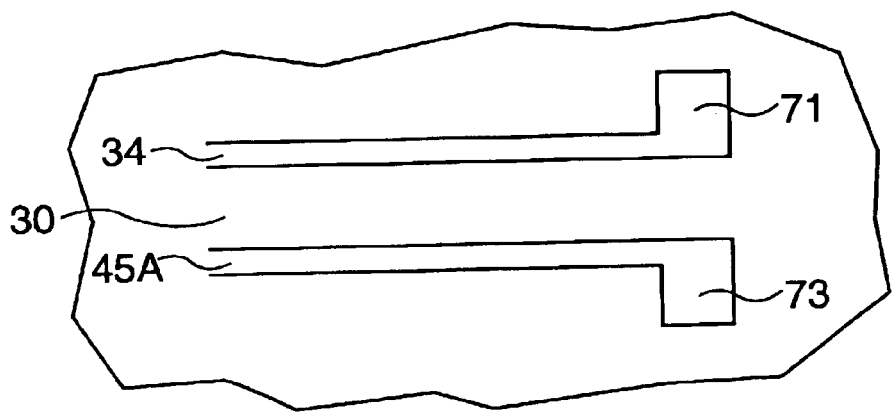
FIG. 7 is a top view of capacitors fabricated according to this invention.

Contacts are now made to the capacitor. An exemplary contact scheme is depicted in FIG. 7. Depicted are first and second metal plates 34 and 45A separated by the dielectric layer 30. First and second plates 34 and 45A are formed by metal regions 34 and 45A, respectively. Contacts 71 and 73 are used for making electrical contacts to the first and second plates 34 and 45A, respectively. The contacts depicted are wide areas at the end of the capacitor plates. The contact areas are shown as being at the same end of the capacitor plates; they could be at opposite ends of the capacitor plates.

Of course, one contact could be at the upper dielectric level and one contact could be at the lower dielectric level.

Figure 8:
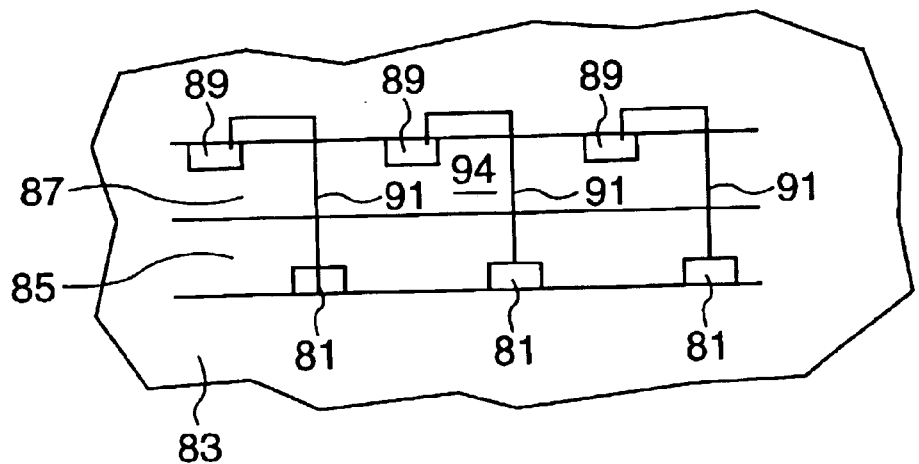
FIG. 8 is a sectional view of an integrated circuit fabricated according to this invention.

FIG. 8 is a schematic depiction of the completed integrated circuit. Depicted are devices 81 on substrate 83 which are covered by a first dielectric layer 85 and second dielectric layer 87. Capacitors 89 are formed in the second dielectric layer 87. Electrical connections 91 between devices 81 and capacitors 89 are through dielectric layers 85 and 87. Several elements, including the final passivation layer and packaging are not depicted as they are not required for an understanding of this invention.

Variations in the embodiment described are contemplated and will be readily apparent to those skilled in the art. For example, tungsten deposition by chemical vapor deposition is invariably preceded by deposition of a TiN adhesive (glue) layer to promote adhesion of the tungsten to the underlying dielectric.

I claim:

1. A method of fabricating an integrated circuit comprising the steps of:
    forming a dielectric layer on a substrate;
    patterning said dielectric layer to form trenches;
    forming first metal regions in said trenches, said first metal regions and said dielectric layer having a planar surface;
    patterning a resist layer to form openings which expose portions of said first metal regions and adjacent dielectric layer;
    etching said exposed first metal regions and said dielectric to form trenches;
    depositing an insulating layer;
    forming second metal regions; and
    planarizing the surface of said first and second metal regions and said dielectric.

2. The method of claim 1 in which at least one of said first and second metal regions comprises copper.

3. The method of claim 2 further comprising the step of depositing a barrier layer prior to the forming said first metal regions.

4. The method of claim 1 further comprising the step of fabricating transistors prior to the step of forming a dielectric layer on the substrate.

5. The method of claim 1 in which said depositing an insulating layer step includes a conformal depositing.

6. The method of claim 2 in which said etching step includes etching substantially through said dielectric layer to said substrate.

7. A method of forming capacitors in a first dielectric layer comprising the steps of:
    forming a plurality of trenches in the first dielectric layer, said trenches being filled with a first metal to form first metal regions, said first metal regions and said dielectric layer forming a planar surface;
    selectively removing portions of said first metal regions and said adjacent dielectric layer;
    sequentially depositing a second dielectric layer and then a second metal; and
    planarizing said second metal layer to form separated second metal regions which are separated from the first metal regions by portions of the second dielectric layer.

8. The method of claim 7 further comprising the step of forming electrical contacts to first and said second metal regions.

9. The method of claim 7 in which said selectively removing step includes anisotropic etching.

10. The method of claim 7 further comprising the step of depositing a barrier layer prior to depositing of said first metal in said trenches.

11. The method of claim 7 in which said sequentially depositing step deposits a dielectric selected from the group consisting of silicon oxide, silicon nitride, and silicon oxynitride.

* * * * *

UNITED STATES PATENT AND TRADEMARK OFFICE
CERTIFICATE OF CORRECTION

PATENT NO. : 6,706,588 B1
DATED : March 16, 2004
INVENTOR(S) : Xian J. Ning

It is certified that error appears in the above-identified patent and that said Letters Patent is hereby corrected as shown below:

Column 1,
Line 11, "integrated" should read -- Integrated --.

Column 6,
Line 9, delete "2" and insert therefor -- 1 --.

Signed and Sealed this

Twelfth Day of October, 2004

JON W. DUDAS
*Director of the United States Patent and Trademark Office*